United States Patent [19]
Xiaobing et al.

[11] Patent Number: 5,387,556
[45] Date of Patent: Feb. 7, 1995

[54] ETCHING ALUMINUM AND ITS ALLOYS USING HCl, Cl-CONTAINING ETCHANT AND $N_2$

[75] Inventors: Diana M. Xiaobing, San Jose; Charles S. Rhoades, Los Gatos, both of Calif.

[73] Assignee: Applied Materials, Inc., Santa Clara, Calif.

[21] Appl. No.: 21,831

[22] Filed: Feb. 24, 1993

[51] Int. Cl.$^6$ .................................. H01L 21/283
[52] U.S. Cl. ................................ 437/228; 156/643; 156/646; 156/665
[58] Field of Search ............... 437/228; 156/643, 646, 156/665

[56] References Cited

U.S. PATENT DOCUMENTS

| | | | |
|---|---|---|---|
| 3,994,793 | 11/1976 | Harvilchuck et al. | 156/646 |
| 4,350,563 | 9/1982 | Takada et al. | 156/643 |
| 4,370,196 | 1/1983 | Vossen, Jr. et al. | 156/643 |
| 4,373,990 | 2/1983 | Porter | 156/643 |
| 5,126,008 | 6/1992 | Levy | 156/665 |
| 5,185,058 | 2/1993 | Cathey, Jr. | 156/656 |
| 5,207,868 | 5/1993 | Shinohara | 156/656 |
| 5,211,804 | 5/1993 | Kobayashi | 156/665 |

OTHER PUBLICATIONS

Grewal et al., *Aluminum Etchng with TCP Using Hydrogen Chloride and Chlorine Chemistries.* SemiCon West Technical Symposium, Jun. 1992.

Rhoades, *Advanced Aluminum Etching in the Precision 5000 TM Mark II Aluminum Etch System,* ACET in Review, Winter, 1992, Applied Materials, Inc.

*Primary Examiner*—T. N. Quach
*Attorney, Agent, or Firm*—Peter G. Sgarbossa; Jeffrey G. Sheldon; Robert J. Stern

[57] ABSTRACT

A process for etching aluminum from a substrate, where portions of the aluminum are protected by a resist material, is described. The substrate is placed into a chamber and a process gas comprising HCl, Cl-containing etchant and $N_2$ is introduced in the chamber. A plasma is generated in the chamber to generate from the process gas an etch gas that etches aluminum from the substrate at fast rates, with good selectivity, reduced profile microloading, and substantially only anisotropic etching.

48 Claims, No Drawings

ETCHING ALUMINUM AND ITS ALLOYS USING HCl, Cl-CONTAINING ETCHANT AND $N_2$

BACKGROUND

The present invention relates to processes for etching aluminum from a substrate.

Reactive ion etching processes are used in the fabrication of semiconductor and other devices with submicron sized features, such as integrated circuit chips. These processes are used to etch aluminum alloys from a surface of a silicon wafer, where portions of the aluminum are protected by a pattern of an etch-resistant "resist" material, such as photoresist or oxide-hardmask. The protected aluminum portions form "features" which are left on the silicon wafer to form part of the integrated circuits being processed on the wafer. Etching is effected by introducing a process gas into a chamber, generating a plasma in the chamber to create an etch-gas that etches aluminum from the substrate to create a volatile aluminum-containing compound, such as $AlCl_3$, and removing the volatile aluminum-containing compound from the chamber.

Typically, the process gas comprises $BCl_3$ and $Cl_2$, and optionally $N_2$. A problem with this process gas is that relatively thick residues or deposits containing Al, Cl, B and N, form on the chamber walls and on the resist material. The deposit on the chamber walls can form particles that contaminate the wafers. Further, the resist material can have excessive amounts of residue form on it, thereby undesirably increasing the area protected by the resist material. These problems can render the processed wafer unsuitable for use.

A deposit layer can also form on the sidewalls of the freshly etched channels in the aluminum containing layer. This deposit layer serves as a "passivating" barrier which hinders continued etching, thereby preventing "isotropic" etching or undercutting. Isotropic etching occurs when etching proceeds horizontally below the resist layer, instead of vertically through the uncoated portions, resulting in the lower portions of the features being inwardly sloped. Although vertical "anisotropic" etching is desirable, an excessive passivating layer on the sidewalls is difficult to subsequently clean-off. With typical $BCl_3$ based systems, it is difficult to control the amount of deposit on the sidewalls.

Furthermore, typical $BCl_3$ based systems result in increased profile microloading, which occurs when the cross-sectional profile of the features formed in the aluminum containing layer vary as a function of the spacing between the features. It is desirable to have an etching process which provides features with a uniform cross-section regardless of the spacing between the features.

It is also desirable to obtain high etch rates and a high aluminum to resist etching selectivity ratio for process efficacy.

Accordingly, there is a need for a process for etching aluminum-containing materials which minimizes contamination of the chamber and the substrate, which is substantially only anisotropic, which does not result in formation of oversized features, which provides reduced profile microloading, and which does not form excessive deposit on the sidewalls of the etched channels. It is also desirable to obtain high etch rates and a high aluminum to resist selectivity ratio.

SUMMARY

The present invention is directed to a process that satisfies these needs. In particular, the present invention provides a process for removing at least a portion of an etchable aluminum-containing layer from a substrate. In the process, the substrate is placed in a chamber, a process gas comprising HCl, Cl-containing etchant, and $N_2$ is introduced into the chamber. The term "Cl-containing etchant" excludes HCl, i.e., the process gas cannot contain only HCl and $N_2$. The Cl-containing etchant can comprise $Cl_2$, $SiCl_4$, $CCl_4$, $BCl_3$, and mixtures thereof. A plasma is generated in the chamber to generate an etch gas that etches aluminum from the substrate, thereby creating a volatile aluminum-containing compound, which is subsequently removed from the chamber.

Typically, the substrate is a silicon wafer, and the etchable aluminum layer has a pattern of resist material thereon to prevent etching of the aluminum-containing material under the pattern. There can also be a plurality of barrier layers between the etchable layer and the silicon wafer, and there can be a layer on top of the aluminum-containing layer, such as an antireflective coating.

The substrate is typically placed on a cathode in the etch chamber, and the cathode is heated, to a temperature sufficiently high to volatilize etching byproducts, such as $AlCl_3$, formed during the etching process. The temperature to which the cathode is heated is sufficiently low so that a thin layer of passivating deposit formed on the etched aluminum is not volatilized.

Typically, the process gas consists essentially of HCl, Cl-containing etchant and $N_2$. The Cl-containing etchant can consist essentially of $Cl_2$, $SiCl_4$, $CCl_4$, $BCl_3$, or mixtures thereof, and preferably the Cl-containing etchant is $Cl_2$. Preferably the process gas contains sufficient $N_2$ that substantially no aluminum-containing material below the resist is etched, and substantially only anisotropic etching of the aluminum occurs.

By proper control of the composition of the process gas, the aluminum to resist selectivity ratio can be greater than 4, and the etch rate can be greater than 5000 Å per minute, and even greater than 10,000 Å per minute. Typically the volumetric flow ratio of Cl-containing etchant to HCl is from about to 10:1 to about 0.1:1, and the volumetric flow ratio of Cl-containing etchant to $N_2$ is from about 10:1 to about 0.1:1.

The etching can be effected in a plasma process or in an enhanced plasma process. The enhancement can be obtained by magnetic field or inductive coupling, such as by electron cyclotron resonance, a magnetically enhanced reactor, or an inductively coupled plasma. Preferably a magnetically enhanced reactive ion reactor is used.

The experimental work described below reveals that a process according to the present invention is a clean, substantially anisotropic process, with reduced particulate and deposit contamination compared to prior art $BCl_3$—$Cl_3$—$N_2$ process, as well as having high etch rates, good aluminum to resist selectivity, and reduced profile microloading.

These and other features, aspects, and advantages of the present invention will become better understood from the following description and appended claims.

DESCRIPTION

The present invention is directed to a process for etching aluminum from a substrate in an ion enhanced plasma process, where a process gas is introduced into an etch chamber, the process gas comprising HCl, Cl-containing etchant and $N_2$. The term "Cl-containing etchant" excludes HCl, i.e., the process gas cannot contain only HCl and $N_2$. The Cl-containing etchant can comprise of $Cl_2$, $SiCl_4$, $CCl_4$, $BCl_3$, or mixtures thereof.

The substrate can be anything on which an aluminum containing layer is deposited, including silicon wafers, glass, and metal substrates. Typically the substrate is a silicon wafer containing multiple layers, one of which is an aluminum-containing layer. Between the silicon wafer and the aluminum-containing layer there can be a base or barrier layer of TiN, TiW, W, an oxide of silicon, or the like, or mixtures thereof. The aluminum-containing layer can be also be coated with an antireflective coating, such as TiN, TiW, W, and the like.

The layer containing aluminum can be substantially pure aluminum, or more typically an alloy of aluminum, such as an alloy of aluminum with one or more of the following materials: copper, silicon and/or titanium.

Typically a portion of the aluminum-containing layer is protected by a patterned overlay of a resist material, so that a portion of the aluminum-containing layer is not etched away, thereby leaving features that form part of semiconductor devices. These features can be of sizes from about 10 micron to about 0.5 to 0.6 micron or less, with close spacing, again on the order of 0.5 to 0.6 micron.

The substrate is typically placed on a cathode in the etch chamber, and the cathode is heated, to a temperature sufficiently high to volatilize etching byproducts, such as $AlCl_3$, formed during the etching process, but sufficiently low so that the layer of passivating deposit formed on the sidewalls of the newly etched channels is not volatilized. Typically, the cathode is heated to a temperature of at least 70° C., more typically to a temperature from about 70° C. to about 100° C., and preferably to a temperature from about 80° to about 90° C.

Preferably, the process gas consists essentially of HCl, Cl-containing etchant and $N_2$. The Cl-containing etchant can consist essentially of $Cl_2$, $SiCl_4$, $CCl_4$, $BCl_3$, or mixtures thereof. Preferably, the Cl-containing etchant is $Cl_2$. The volumetric flow ratio of the Cl-containing etchant to HCl is from about 10:1 to about 0.1:1. If the ratio is too high, i.e., there is too much Cl-containing etchant, the aluminum under the resist material can be etched. If the ratio is too low, i.e., there is insufficient Cl-containing etchant, the etch rate is too low for commercial purposes. For these reasons, preferably, the volumetric flow ratio of Cl-containing etchant to HCl is from about 8:1 to about 1:1, and more preferably at least about 4:1.

It is believed that the ratio of Cl-containing etchant to nitrogen controls the etch rate, the amount of deposit formed on the chamber walls, and the amount of deposition on the etched channel sidewalls. Too little nitrogen results in undercutting, i.e., etching of the aluminum below the resist material. Too much nitrogen, results in slow etch rates, and the formation of excessive amounts of deposit on the chamber walls and the channel sidewalls. The amount of nitrogen included in the process gas is sufficiently large that substantially no aluminum below the resist is etched, and substantially only anisotropic etching of the aluminum occurs. For these reasons, typically the Cl-containing etchant to nitrogen volumetric flow ratio is from about 10:1 to about 0.1:1, preferably from about 5:1 to about 2:1, and most preferably no more than about 4:1.

By the term "volumetric flow ratio" it is meant the ratio of (i) the volume per unit time of one gas, to (ii) the volume per unit time of the second gas.

Under plasma conditions, the introduced process gas forms an etch gas, which is capable of etching away aluminum and its alloys, producing volatile aluminum-containing materials, such as $AlCl_3$, which are removed as a gas from the chamber. The resist material protects the underlying aluminum, with the result that aluminum features form in the non-etched regions. The amount of power required to generate the plasma is typically from 100 to 1000 watts, and can be from 500 to 1000 watts, and most typically from about 600 to about 850 watts.

The etching can be effected in an enhanced plasma process. The enhancement may be obtained by magnetic field or inductive coupling, such as where the enhancement is by electron cyclotron resonance, a magnetically enhanced reactor, or an inductively coupled plasma. Preferably a magnetically enhanced reactive ion reactor is used.

The magnetic field in the reactor must be sufficiently strong to increase the density of ions formed in the plasma, but not so strong as to induce charge-up damage which would damage features such as CMOS gates. Generally, the magnetic field on the wafer surface is no more than 500 gauss, typically it is from about 20 to about 80 gauss, and most preferably it is from about 40 to about 60 gauss. A maximum limit of 60 gauss is preferred to reduce the possibility of charge-up damage to gates in the magnetically enhanced reactor.

Typically the chamber is maintained at a pressure of from about 1 mTorr to about 300 mTorr, preferably at least about 100 mTorr, and most preferably from about 200 to about 250 mTorr.

The process conditions can be varied during the etching process. For aluminum-containing layers that have a protective coating or over layer, typically the process has three stages. In a first, relatively slow stage, process conditions are chosen to effectively etch away the antireflective coating and etch into the aluminum-containing layer. Then the process is accelerated in a second, main etch stage, with more severe conditions, to quickly etch away the aluminum layer. Just about when the aluminum layer is completely etched away, or after it has been etched away and etching has proceeded into the layer below the aluminum layer, the process is completed in a third stage under less severe conditions. After etching, the substrate is cleaned to remove resist materials, and any deposits, such as sidewall deposits left on the wafer. The process parameters of such multiple stage processes are provided in the Examples 1–12 below.

During the first stage, an etch rate typically of less than 1000 Å per minute is satisfactory. The main etch preferably is at least 5000 Å per minute for a commercially feasible process, and more preferably is greater than about 10,000 Å per minute. It is difficult to etch at a rate in excess of 15,000 Å per minute because, at such high rates, the amount of non-etched impurities contained in the aluminum-containing layer which remain on the layer increases. The etch rate during the final etch stage is typically at a rate of from about 3000 to 5000 Å per minute.

A process according to the present invention is effective. Etch rates in excess of 5000 Å per minute during the main etch can be achieved, with substantially no undercutting, i.e., substantially no aluminum below the resist being etched, and with substantially only anisotropic etching of the aluminum-containing layer occurring. Greatly reduced amounts of contamination of the chamber result, and the layer of passivating deposit on the side walls of the newly etched channels is relatively easy to clean-off. Moreover, the ratio of etching of the aluminum-containing layer to etching of the resist layer, i.e., the aluminum to resist selectivity ratio, can be greater than 6.

Furthermore, existing equipment currently used for the $BCl_3$—$Cl_2$—$N_2$ process can be used, with the only possible modification needed is that materials more resistant to corrosion by HCl be used. These corrosion resistant materials can be chrome or molybdenum impregnated steel.

The following examples demonstrate the efficacy of the present invention.

EXAMPLES 1-4

These examples demonstrate that a process according to the present invention has a high etch rate (greater than 5000 Å per minute), good aluminum to resist selectivity, and satisfactory sidewall profiles for the features formed below the resist.

Tests were undertaken using a magnetically enhanced reactive ion reactor, and in particular a Precision 5000 TM Mark II system available from Applied Materials, Inc., Santa Clara, California, utilizing an Aluminum etch Phase II process kit, also available from Applied Materials. The wafers used were silicon wafers of 200 mm diameter coated successively with 5000 Å oxide layer; 1000 Å layer of titanium; 1.0 micron layer of aluminum, containing 0.5% copper; a TiN layer of 4000 Å; and resist in selected areas in a thickness of 1.45 microns. A G line photoresist material was used. The resist was placed on about 50% of the surface area of the wafer, to generate features of varying spacing and size. The highest density features were spaced apart by 0.8 microns, where the features were 0.6 microns wide.

The wafers were etched in three stages, a preliminary etch, a main etch, and a final etch. Two different types of final etches were used. The process conditions for the preliminary and final etches are summarized in Table 1. The preliminary etch was timed to go to breakthrough, i.e., where the overlayer of TiN was etched through so that the aluminum layer was beginning to be etched. The main etch was conducted until the aluminum alloy was etched through, and etching of the underlayer of TiN began. The final etch was timed so that the underlayer of TiN was etched through and etching was going into the substrate. The progress of the etch was monitored by monitoring the composition of the gas withdrawn from the chamber using an optical emission technique.

During the main etch, the wall temperature was maintained at 65° C. and helium at a pressure of 10 Torr was maintained on the backside of the wafer for temperature control.

The etch profiles, resist remaining, sidewall smoothness, and amount of residue remaining were evaluated from SEM photos of the etched wafers. The aluminum etch rate was calculated by measuring the depth of the features in partially etched wafers. Resist stripability (ability to strip the remaining resist from the wafer), and sidewall deposition removal (ability to remove deposits on the sidewalls of the aluminum features), were tested by dry stripping alone or in combination with a wet process. The dry strip was carried out either in a Branson resist asher, with an ashing time of 75 minutes, or in a GaSonics resist stripper for 2 minutes. The wet process can either be a dip at 90° C. for 10 minutes in a conventional stripping product sold under the trademark "ACT-150," or a dip at room temperature for 3 minutes in a conventional ethylene glycol based stripping solvent sold under the trademark "ASHLAND ROA".

The results of the experiments are provided in Table 2. The results show an aluminum to resist etch ratio greater than 4 was achieved in Example 4. Very smooth sidewalls were achieved in Examples 3 and 4, with satisfactory side profiles of the remaining aluminum, both for densely packed features and isolated features. Sidewall depositions were found, particularly in areas where the features were close to each other. No visible rabbit ear was noted. The sidewall deposition and the resist residues can be completely removed by either an "ACT-150" dip at 90° C. for 10 minutes or an "ASHLAND ROA" dip at room temperature for 3 minutes.

EXAMPLES 5-10

These Examples demonstrate that a process according to the present invention is cleaner than a prior art $BCl_3$—$Cl_2$—$N_2$ process with regard to deposition on chamber walls.

The wafers used were the same as for Examples 1-4. The process conditions used are presented in Table 3. The cathode was maintained at 80° C., the wall temperature at 65° C., and the backside of the wafer was exposed to 10 Torr of helium.

The results of the tests are presented in Example 10. Generally the $BCl_3$—$Cl_2$—$N_2$ had 5.5 times more deposition on the chamber wall than the $HCl$—$Cl_2$—$N_2$ process. Thus, the $HCl$—$Cl_2$—$N_2$ chemistry substantially reduces deposition on the chamber wall, thereby improving chamber cleanliness.

EXAMPLES 11 AND 12

Examples 11 and 12 demonstrate that a process according to the present invention can achieve very high aluminum etch rates.

The wafers used for these Examples were the same as for Examples 1-4. The process conditions are summarized in Table 5. The cathode was maintained at 80° C., and 10 Torr of helium was used on the backside of the wafer.

The main etch for Example 11 was conducted until substantially all the aluminum had been etched. This is designated in Table 5 as "EPB" which stands for "end point at bottom."

For Example 12, the main etch was stopped at "EPT," which represents "end point when top". The etch was stopped when a reduction in the amount of aluminum in the withdrawn gas was first observed.

The aluminum etch rate for Example 11 was 7317 Å/minute and for Example 12 14000 Å/minute. The average resist remaining was 9426 Å for Example 11 and 13000 Å for Example 12. The aluminum to resist selectivity ratio was 4.58 for Example 11 and greater than 6 for Example 12. There was very little residue left on the wafers; some residue was left in a center dense area for both Examples, and a small amount of residue in a dense area for Example 11.

TABLE 1

PROCESS CONDITIONS FOR EXAMPLES 1–4

|  | PRELIMINARY | FINAL A | FINAL B |
|---|---|---|---|
| Pressure (mT) | 30 | 30 | 30 |
| Power (W) | 500 | 200 | 200 |
| DC Bias (−V) | 675 | 433 | 416 |
| Magnetic Field (G) | 0 | 20 | 20 |
| Flow Rates (sccm) | | | |
| $BCl_3$ | 40 | 0 | 0 |
| HCl | 0 | 75 | 75 |
| $Cl_2$ | 10 | 0 | 0 |
| $N_2$ | 10 | 25 | 0 |
| Time (sec) | 30 | 60 | 60 |

TABLE 2

RESULTS AND PROCESS CONDITIONS FOR EXAMPLES 1–4[1]

| EXAMPLE | 1 | 2 | 3 | 4 |
|---|---|---|---|---|
| Pressure (mT) | 200 | 200 | 200 | 200 |
| Power (W) | 800 | 800 | 800 | 800 |
| Magnetic Field (G) | 60 | 60 | 60 | 60 |
| Flow Rate (sccm) | | | | |
| HCl | 90 | 90 | 68 | 68 |
| $Cl_2$ | 40 | 40 | 67 | 67 |
| $N_2$ | 10 | 20 | 10 | 20 |
| Final Etch | A | B | B | A |
| Etch Rate (Å/min) | 5058 | 5042 | 7968 | 8322 |
| PR[2] Left (Å) | 8033 | 7622 | 7377 | 8525 |
| Al:PR Ratio | 2.97 | 2.75 | 3.31 | 4.10 |
| Dense Prof (°) | 88 | 90 | 90 | 90 |
| ISO Prof (°) | 83 | 83 | 88 | 88 |
| Sidewall Smoothness[3] | 2 | 2 | 4 | 1 |

[1]All process conditions are for main etch. Preliminary etch and final etch conditions are listed in Table 1.
[2]Photoresist layer
[3]Sidewall smoothness was evaluated on 0.6 micron dense lines since sidewall lines spaced greater than 1.0 micron were smooth in all runs. A sidewall with smoothness of 0 means very smooth.

TABLE 3

PROCESS CONDITIONS FOR EXAMPLES 5–10

| | $HCl-Cl_2-N_2$ | | | $BCl_3-Cl_2-N_2$ | | |
|---|---|---|---|---|---|---|
| | Preliminary | Main | Final | Preliminary | Main | Final |
| Pressure (mT) | 30 | 200 | 30 | 30 | 200 | 30 |
| Power (W) | 500 | 800 | 250 | 500 | 800 | 350 |
| Magnetic Field (G) | 0 | 60 | 20 | 0 | 20 | 0 |
| Flow Rate (sccm) | | | | | | |
| $BCl_3$ | 40 | 0 | 0 | 40 | 50 | 25 |
| HCl | 0 | 68 | 75 | 0 | 0 | 0 |
| $Cl_2$ | 10 | 67 | | 10 | 50 | 30 |
| $N_2$ | 10 | 20 | 20 | 10 | 50 | 1 |
| Time (sec) | 30 | 90 | 50 | 30 | 120 | 50 |

TABLE 4

DEPOSITION THICKNESS IN ANGSTROMS (Å) ON CHAMBER WALL FOR EXAMPLES 5–10

| EXAMPLE | $HCl-Cl_2-N_2$ | $BCl_3-Cl_2-N_2$ |
|---|---|---|
| 5 | 901/312 | 3958/278 |
| 6 | 661/212 | 3324/749 |
| 7 | 579/349 | 3916/671 |
| 8 | 415/147 | 3998/352 |
| 9 | 583/456 | 2660/378 |
| 10 | 770/529 | 3720/795 |

TABLE 5

EXAMPLES 11 AND 12 PROCESS CONDITIONS[4]

| | Preliminary | Example 11 Main | Example 12 Main | Final |
|---|---|---|---|---|
| Pressure (mT) | 30 | 200 | 250 | 30 |
| Power (W) | 500 | 800 | 700 | 250 |
| Magnetic Field (G) | 0 | 60 | 60 | 20 |
| Flow Rate (sccm) | | | | |
| $BCl_3$ | 40 | 0 | 0 | 0 |
| HCl | 0 | 30 | 10 | 75 |
| $Cl_2$ | 10 | 60 | 80 | 0 |
| $N_2$ | 10 | 30 | 30 | 15 |
| Time (sec) | 30 | EPB* | EPT** | 60 |

*EPB = End point at bottom
**EPT = End point when top
[4]Same preliminary and final process conditions were used for Examples 11 and 12.

Although the present invention has been discussed in considerable detail with reference to certain preferred versions thereof, other versions are possible. Therefore, the spirit and scope of the appended claims should not be limited to the description of the preferred versions contained herein.

Same preliminary and final process conditions were used for Examples 11 and 12.

What is claimed is:

1. A process for removing a material containing aluminum from a substrate, the process comprising the steps of:
   (a) placing into a chamber a substrate having a layer thereon of a material comprising aluminum;
   (b) introducing a process gas comprising HCl, $Cl_2$, and $N_2$ into the chamber;
   (c) generating a plasma in the chamber to generate from the process gas, an etch gas that etches aluminum from the substrate to generate a volatile aluminum-containing compound; and
   (d) removing the volatile aluminum-containing compound from the chamber.

2. The process of claim 1 wherein the process gas consists essentially of HCl, $Cl_2$ and $N_2$.

3. The process of claim 1 wherein a portion of the layer has resist thereon to prevent etching of aluminum from the substrate.

4. The process of claim 3 wherein the process gas contains sufficient $N_2$ that substantially no aluminum below the resist is etched.

5. The process of claim 3 wherein the layer of a material comprising aluminum has an antireflective coating thereon, the antireflective coating being between the layer of the material containing aluminum and the resist.

6. The process of claim 3 wherein the process gas contains sufficient $N_2$ that substantially only anisotropic etching of the aluminum occurs.

7. The process of claim 3 where a passivating deposit layer forms on the etched portions of the aluminum, wherein the passivating deposit layer prevents further etching of the etched aluminum thereby yielding substantially anisotropic etching.

8. The process of claim 7 where the wafer is heated to a temperature sufficiently low that any passivating deposit on the etched aluminum is not volatilized.

9. The process of claim 1 where the wafer is heated to a temperature sufficiently high to volatilize the volatile aluminum-containing compound from the chamber.

10. The process of claim 1 wherein the layer of a material comprising aluminum has a coating thereon.

11. The process of claim 1 where the substrate is placed on a support in the chamber, and the support is heated to a temperature above 70° C.

12. The process of claim 1 where the substrate is placed on a support in the chamber, and the support is heated to a temperature between about 70° C. to about 100° C.

13. The process of claim 1 where the substrate is placed on a support in the chamber, and the support is heated to a temperature between about 80° C. to about 90° C.

14. The process of claim 1 where the volumetric flow ratio of Cl-containing etchant:HCl:$N_2$ is selected so that the aluminum to resist selectivity ratio is greater than 4.

15. The process of claim 14 where the step of introducing a process gas comprises introducing sufficient process gas that the etch rate is greater than 5000 angstroms per minute.

16. The process of claim 15 where the step of introducing a process gas comprises introducing sufficient process gas that the etch rate is greater than 10,000 angstroms per minute.

17. The process of claim 1 wherein the pressure in the chamber is maintained greater than 1 mTorr.

18. The process of claim 1 wherein the substrate is a silicon wafer.

19. The process of claim 18 wherein the substrate has a plurality of barrier layers between the layer of a material comprising aluminum and the silicon wafer.

20. The process of claim 19 where the barrier layers consist of materials selected from the group consisting of TiN, TiW, W, and oxides of silicon.

21. The process of claim 1 where the density of the plasma is enhanced by a method selected from the group consisting of electron cyclotron resonance, magnetically enhanced reactors, and inductively coupled plasma.

22. The process of claim 1, wherein the volumetric flow ratio of $Cl_2$ to HCl is from about 8:1 to about 1:1, and the volumetric flow ratio of $Cl_2$ to $N_2$ is from about 5:1 to about 2:1.

23. The process of claim 22, wherein the volumetric flow ratio of $Cl_2$ to HCl is greater than 4: 1.

24. The process of claim 22, wherein the volumetric flow ratio of $Cl_2$ to $N_2$ is greater than 4: 1.

25. A process for removing material containing aluminum from a substrate comprising the steps of:
 (a) placing a silicon wafer into a chamber, the silicon wafer having an aluminum-containing layer thereon, a portion of the aluminum-containing layer having a resist material thereon;
 (b) introducing a process gas comprising HCl, $Cl_2$ and $N_2$ into the chamber, the volumetric flow ratio of $Cl_2$ to HCl being from about 10:1 to about 0.1:1, and the volumetric flow ratio of $Cl_2$ to $N_2$ being from about 10:1 to about 0.1:1;
 (c) generating a plasma in the chamber to generate from the process gas an etch gas that etches portions of the aluminum on the substrate to create a volatile aluminum-containing compound, the etch gas etching the aluminum in preference to the resist material; and
 (d) removing the volatile aluminum-containing compound from the chamber.

26. The process of claim 25 wherein the volumetric flow ratio of $Cl_2$ to HCl is from about 8:1 to about 1:1.

27. The process of claim 26 wherein the volumetric flow ratio of $Cl_2$ to HCl is greater than 4:1.

28. The process of claim 25 wherein the volumetric flow ratio of $Cl_2$ to $N_2$ is from about 5:1 to about 2:1.

29. The process of claim 26 wherein the volumetric flow ratio of $Cl_2$ to $N_2$ is greater than 4:1.

30. The process of claim 25 wherein the step of introducing a process gas comprises introducing the process gas at a volumetric flow rate less than about 500 sccm.

31. The process of claim 25 wherein the process gas contains sufficient $N_2$ that substantially no aluminum below the resist is etched.

32. The process of claim 25 wherein the process gas contains sufficient $N_2$ that substantially only anisotropic etching of the aluminum occurs.

33. The process of claim 25 wherein the step of introducing a process gas comprises introducing sufficient process gas that aluminum is etched at a rate of at least 5,000 angstroms per minute.

34. The process of claim 25 wherein the aluminum-containing layer has a coating thereon, the coating being between the aluminum containing layer and the resist.

35. The process of claim 25 where a passivating deposit layer forms on the etched portions of the aluminum, wherein the passivating deposit layer prevents further etching of the etched aluminum thereby yielding substantially anisotropic etching.

36. The process of claim 35 where the wafer is heated to a temperature sufficiently low that any passivating deposit on the etched aluminum is not volatilized.

37. The process of claim 25 where the wafer is placed on a support in the chamber, and the support is heated to a temperature above 70° C.

38. The process of claim 25 where the wafer is placed on a support in the chamber, and the support is heated to a temperature between about 70° C. to about 100° C.

39. The process of claim 25 where the wafer is placed on a support in the chamber, and the support is heated to a temperature between about 80° C. to about 90° C.

40. The process of claim 25 where the density of the plasma is enhanced by a method selected from the group consisting of electron cyclotron resonance, magnetically enhanced reactors, and inductively coupled plasma.

41. A process for removing material containing aluminum from a silicon wafer comprising the steps of:
 (a) placing a silicon wafer into a chamber, the silicon wafer having an aluminum-containing layer thereon, a portion of the aluminum-containing layer having resist thereon;
 (b) introducing a process gas consisting essentially of HCl, $Cl_2$, and $N_2$ into the chamber at a volumetric flow rate less than about 500 sccm, the volumetric flow ratio of $Cl_2$ to HCl being from about 10:1 to about 0.1:1, and the volumetric flow ratio of $Cl_2$ to $N_2$ being from about 10:1 to about 0.1:1;
 (c) generating a plasma in the chamber to generate from the process gas an etch gas that etches aluminum on the substrate to create a volatile aluminum-containing compound, the etch gas etching aluminum in preference to the resist material; and
 (d) removing the volatile aluminum-containing compound from the chamber,
 wherein the process gas contains sufficient $N_2$ that substantially no aluminum below the resist is etched and substantially only anisotropic etching of the aluminum occurs.

42. A process for removing a material containing aluminum from a substrate, the process comprising the steps of:
(a) placing into a chamber a substrate having a layer thereon of a material comprising aluminum;
(b) introducing a process gas comprising HCl, $Cl_2$ and $N_2$ into the chamber;
(c) generating a plasma in the chamber to generate from the process gas, an etch gas that etches aluminum from the substrate to generate a volatile aluminum-containing compound; and
(d) removing the volatile aluminum-containing compound from the chamber,
wherein the volumetric flow ratio of $HCl:Cl_2:N_2$ is selected so that (i) the aluminum etch rate is greater than 10,000 Å, per minute, (ii) the aluminum to resist etching selectivity ratio is greater than 4, (iii) substantially no deposit forms on the chamber, and (iv) substantially only anisotropic etching of the aluminum occurs.

43. The process of claim 42, wherein the volumetric flow ratio of $Cl_2$ to HCl is from about 8:1 to about 1:1, and the volumetric flow ratio of $Cl_2$ to $N_2$ is from about 5:1 to about 2:1.

44. The process of claim 43, wherein the volumetric flow ratio of $Cl_2$ to HCl is greater than 4: 1.

45. The process of claim 43, wherein the volumetric flow ratio of $Cl_2$ to $N_2$ is greater than 4: 1.

46. A process for removing a material containing aluminum from a substrate, the process comprising the steps of:
(a) placing into a chamber a substrate having a layer thereon of a material comprising aluminum;
(b) introducing a process gas comprising HCl, $Cl_2$ and $N_2$ into the chamber, the volumetric flow ratio of $Cl_2$ to HCl being from about 8:1 to about 1:1, and the volumetric flow ratio of $Cl_2$ to $N_2$ being from about 5:1 to about 2: 1;
(c) generating a plasma in the chamber to generate from the process gas, an etch gas that etches aluminum from the substrate to generate a volatile aluminum-containing compound; and
(d) removing the volatile aluminum-containing compound from the chamber.

47. The process of claim 46, wherein the volumetric flow ratio of $Cl_2$ to HCl is greater than 4: 1.

48. The process of claim 46, wherein the volumetric flow ratio of $Cl_2$ to $N_2$ is greater than 4: 1.

* * * * *

UNITED STATES PATENT AND TRADEMARK OFFICE
CERTIFICATE OF CORRECTION

PATENT NO. : 5,387,556
DATED : February 7, 1995
INVENTOR(S) : Xiaobing, et al.

It is certified that error appears in the above-indentified patent and that said Letters Patent is hereby corrected as shown below:

Title page, item [19], delete "Xiaobing et al." and replace with --Ma et al.--;

Title page, item [75], delete "Diana M. Xiaobing, San Jose;" and replace with --Xiaobing Diana Ma, San Jose;--

Signed and Sealed this

Eleventh Day of July, 1995

Attest:

BRUCE LEHMAN

*Attesting Officer*      *Commissioner of Patents and Trademarks*